United States Patent
Gravell et al.

(12) 
(10) Patent No.: US 6,205,881 B1
(45) Date of Patent: Mar. 27, 2001

(54) DEVICE FOR CONTROLLING THE DRIVE OF MECHANISMS OPERATING SEPARATELY FROM ONE ANOTHER

(75) Inventors: Lawrence R. Gravell; John C. Pflueger, both of Austin, TX (US)

(73) Assignee: Brooks Automation GmbH, Jena (DE)

( * ) Notice: Subject to any disclaimer, the term of this patent is extended or adjusted under 35 U.S.C. 154(b) by 0 days.

(21) Appl. No.: 09/170,575

(22) Filed: Oct. 13, 1998

(51) Int. Cl.⁷ .............................. B60P 1/64; B65G 67/00; B65G 49/07
(52) U.S. Cl. .................... 74/483 R; 192/93 C; 414/401; 414/940
(58) Field of Search .................. 74/665 F, 371, 74/372, 665 K, 483 R; 414/536, 584, 940, 401; 192/48.91, 71, 93 C, 96

(56) References Cited

U.S. PATENT DOCUMENTS

| | | | | |
|---|---|---|---|---|
| 2,474,789 | * | 6/1949 | Perhacs | 192/93 C |
| 2,521,729 | * | 9/1950 | Keese | 74/15.4 |
| 4,029,221 | * | 6/1977 | Nakai et al. | 414/401 |
| 4,541,768 | * | 9/1985 | Walker et al. | 414/536 |
| 4,671,728 | * | 6/1987 | Clarke et al. | 414/401 |
| 4,818,171 | * | 4/1989 | Burkholder | 414/401 |
| 5,012,907 | * | 5/1991 | Fujioka et al. | 192/93 C |
| 5,570,990 | * | 11/1996 | Bonora et al. | 414/940 |

* cited by examiner

*Primary Examiner*—David A. Bucci
*Assistant Examiner*—William C Joyce
(74) *Attorney, Agent, or Firm*—Perman & Green, LLP.

(57) ABSTRACT

In a device for controlling the drive of mechanisms operating separately from one another, the object is to minimize the operating effort and expense of driving alternatively operating mechanisms. Furthermore, it is ensured by the device that the mechanisms are only allowed to be put into operation if they are in a specific state and that this state is maintained throughout their operation. The device has power transmission capabilities different from one another for adjusting the control system to different states of the mechanisms. Arrangements provided for this purpose operate in different settings, determined by control signals, of which a first setting prevents a power transmission and further settings respectively permit power transmission to one of the mechanisms. The arrangement for power transmission is equipped with a signal-receiving device, with which a reception of the control signals dependent on the state of the mechanisms takes place. The signal-receiving device is connected to a signal generator, which generates the control signals for the power transmission. Such devices may be used for operating transfer devices for transferring objects between two locations, such as are required in semiconductor factories and by manufacturers for equipping such factories.

7 Claims, 5 Drawing Sheets

DEVICE FOR CONTROLLING THE DRIVE OF MECHANISMS OPERATING SEPARATELY FROM ONE ANOTHER

BACKGROUND OF THE INVENTION a) Field of the Invention

The invention relates to a device for controlling the drive of mechanisms operating separately from one another, the control being adapted to different states of the mechanisms.

Such devices may be used, inter alia, for transfer devices for transferring objects between two locations, such as are required in semiconductor factories and by manufacturers for equipping such factories. The objects may be, for example, transport containers for material transport; the locations may be processing stations or depositing locations spatially removed from one another.

b) Description of the Related Art

In semiconductor factories, it is customary to transport the substrates to be processed in open or closed containers between different locations and different processing devices by transport devices specially designed for the purpose. In such cases, the handling of the containers during the required loading and unloading operations is to take place in an ergonomic way for the operating personnel. The latter is of special significance with the increasing size of substrates to be processed and the associated increase in size and weight of the containers.

Known simple transport carriages have a simple storage capability for the containers and require loading and unloading by the operating personnel.

Such a solution is important particularly whenever a transport system has to be used as an interim solution for an automatic system, because the containers to be transported exceed the ergonomically admissible limit. Specifically in the early and medium-term construction phase of semiconductor factories, manually operated transport systems are required in order to optimize fitting out and work procedures. However, such interim solutions usually rule out fully automatic systems with complicated and expensive electronics and sensor systems, for reasons of cost. This also applies to a mobile loading device according to U.S. Pat. No. 5,570,990 in the form of a carriage having a multi-member, swivelling transport arm, the members of which are pivotally connected to one another by joints and which is fastened to the upper end of a vertically adjustable shaft. The swivelling transport arm serves for transporting SMIF containers to a semiconductor processing installation and back to the carriage. For this purpose, the containers are seized by a gripper and set down at a depositing location of the semiconductor processing installation by a swivelling movement. The return transport takes place in the reverse way. Means for communication between the semiconductor processing installation and the carriage control monitor the procedures. While the operating personnel has to perform the movements with the transport arm in the x-y plane by turning the joints between the members of the transport arm without additional aids, a motor-driven auxiliary device is provided to relieve the work involved in the case of heavier items for the z movement of the transport arm.

It is disadvantageous that operating procedures separate from one another are required for different directions of the transport movement. This makes both the working sequence and the constructional design of the transporting device complicated and consequently costly.

As already described in U.S. patent application Ser. No. 08/977,588, it is often advantageous when using simple transport carriages to provide mechanisms in duplicate for the containers. If the transporting carriage is brought up to a processing device for loading and unloading, it is always possible to put into operation just the mechanism which is aligned with the processing device as the reference location. If one of the mechanisms is in operation, it is intended that the transport carriage be hindered from being able to move away from the reference location.

Both for reasons of expense and for reasons of user friendliness, it is desirable if just the actuation of a single drive element enables the operating personnel to meet these requirements.

OBJECT AND SUMMARY OF THE INVENTION

The primary object of the invention is therefore to keep down the operating effort and expense of driving alternatively operating mechanisms. Furthermore, it is to be ensured that the mechanisms are only allowed to be put into operation if they are in a specific state and that this state is maintained throughout their operation.

According to the invention, a device which has power transmission capabilities different from one another for adjusting the control system to different states of the mechanisms is provided. Means provided for this purpose operate in different settings, determined by control signals, of which a first setting prevents a power transmission and further settings respectively permit power transmission to one of the mechanisms. The means for power transmission are equipped with a signal-receiving means, with which a reception of the control signals dependent on the state of the mechanisms takes place. The signal-receiving means are connected to a signal generator, which generates the control signals for the power transmission. In a preferred design, the mechanisms serve for transferring items, for which purpose their alignment with respect to a reference location and a coupling at that location are required.

To maintain and to discontinue the coupling state of the mechanisms, the device also includes means for generating further signals, of which a first signal characterizes the power transmission to one of the mechanisms and a second signal characterizes an interruption in the power transmission. While the first signal prevents a change in state of the mechanism which has been put into operation, the second signal allows a change in state.

The mechanisms are advantageously fastened on a mobile base. A blocking device on the mobile base, which prevents or allows a movement away from the reference location, is connected to a device for the signal transmission for the first and second signals. It is also of advantage if the signal generator is in connection with movable coupling elements on the mobile base, which elements engage in fixed coupling elements on the reference location for the purpose of alignment and coupling.

The invention is explained more fully with reference to the drawings.

DESCRIPTION OF THE PREFERRED EMBODIMENTS

Figure 1:
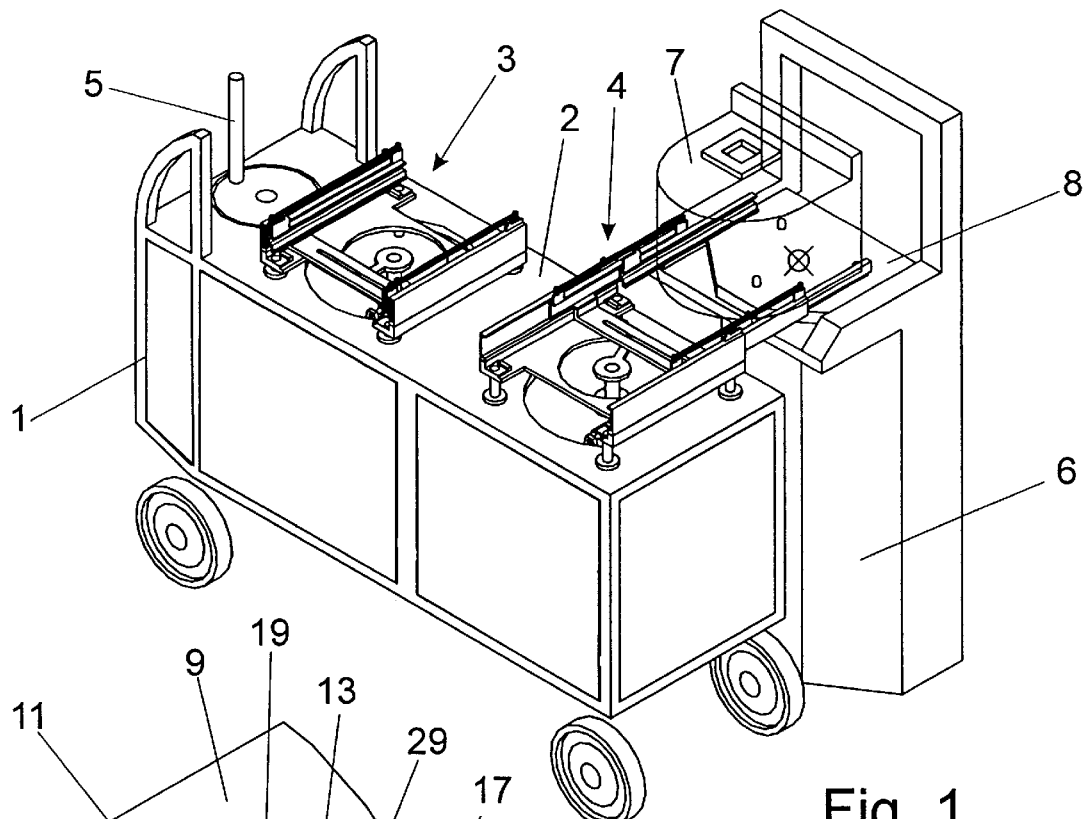
FIG. 1 shows mechanisms for transferring items, the said mechanisms being carried by a mobile base.

The mobile base represented in FIG. 1 in the form of a manually guided vehicle includes on a frame 1 a plate 2 with two mechanisms 3, 4 for the transfer of items, and a drive element 5. The drive element 5 in the present exemplary embodiment is a simple hand crank, but may also be replaced by another suitable element for supplying energy. For force transmission to the respective mechanism 3 or 4, a control device 37 according to FIGS. 7 to 11, which is essential for the subject matter of the invention, is provided. The vehicle is placed before a loading and unloading station 6 as the destination to which an item to be transported, such as a container 7 for example, is to be transferred or from which it is to be removed.

Particularly suitable containers serve for receiving substrates (semiconductor wafers, reticles and templates) or other flat objects with a lateral opening, by which the container 7 can be coupled to the loading and unloading station 6. The transfer of the container 7 to a receiving element 8 takes place with the aid of one of the mechanisms 3, 4. In the present case, it is the mechanism 4, which is already in a partially extended state. The other mechanism 3, on the other hand, is retracted and is in its starting position. For oriented setting down, in the bottom of the container 7 and in the receiving element 8 aligning elements shaped to fit one another, in the form of grooves (not represented) and engaging pins, are provided in a three-point formation.

The container 7, shown only in a very simplified form in FIG. 1, is structurally designed in such a way that the load-bearing parts of the mechanisms 3, 4 are not hindered in their horizontal movement. This concerns both the movement of the mechanism 4 after setting down the container 7 and the functional sequence for its return transport from the receiving element 8 to the vehicle.

It goes without saying that the destination is not restricted to the loading and unloading station 6 shown in this exemplary embodiment, but may also comprise other locations within the range of action of the vehicle.

First, the structural design and operating principle of an aligning and coupling device provided for the vehicle but not shown in FIG. 1 is to be described in more detail with reference to FIGS. 2 to 4, since this device provides essential functional prerequisites for the operating principle of the control device 37.

Figure 2:
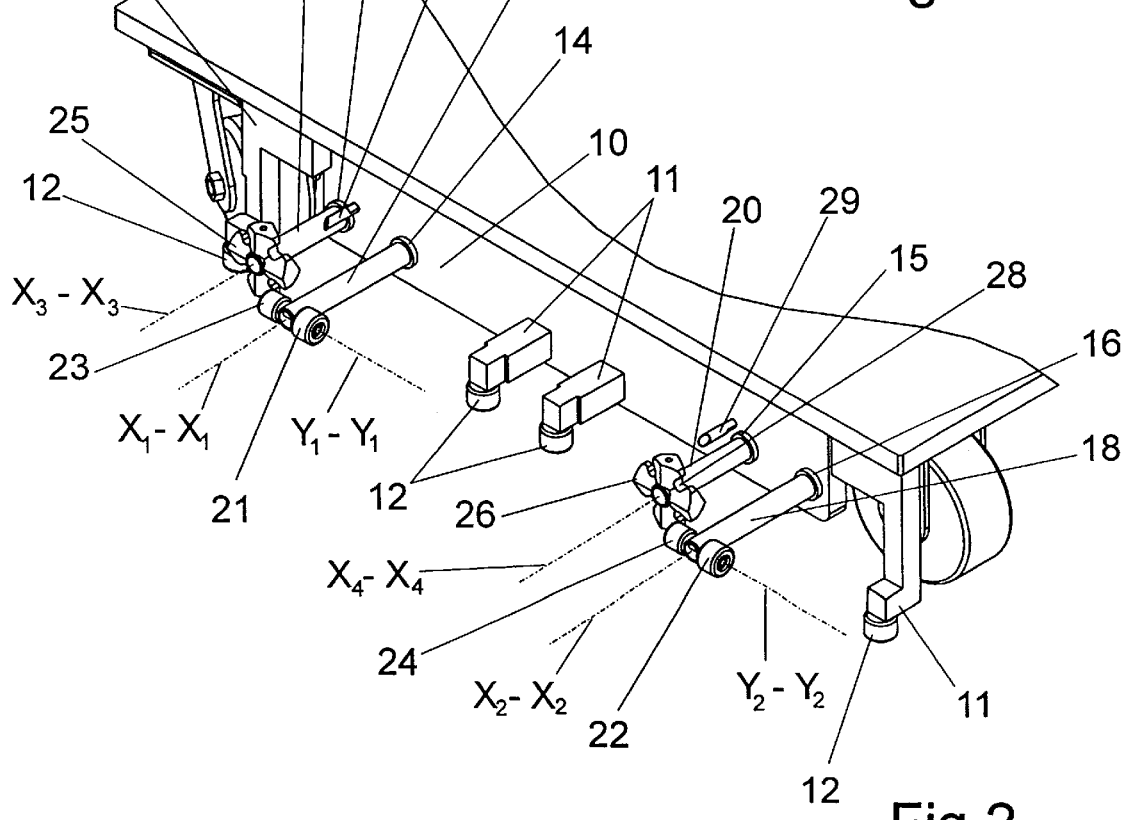
FIG. 2 shows a coupling mechanism for the mobile base.

According to FIG. 2, the aligning and coupling device includes a coupling mechanism, which is fitted in the lower section of the vehicle and faces the destination. On a baseplate 9 and on a carrier rail 10 there are provided fixed roller carriers 11 for receiving guide rollers 12, which fix the minimum distance of the vehicle from a coupling interface present at the destination. Shafts 17, 18, which can rotate about their longitudinal axes $X_1$-$X_1$, $X_2$-$X_2$, $X_3$-$X_3$, $X_4$-$X_4$, and rotatable positioning and locking shafts 19, 20 are led out through bearing bushes 13, 14, 15, 16 in the carrier rail 10 and carry at their ends lying outside the vehicle two types of elements with which the vehicle can be coupled at the coupling interface. In addition to the rotational movement, the shafts 17, 18, 19, 20 can also execute a linear movement along their longitudinal axes $X_1$-$X_1$, $X_2$-$X_2$, $X_3$-$X_3$, $X_4$-$X_4$. The paired design of coupling element ensures the alignment of two mechanisms with respect to the destination. A first type of coupling elements comprises pairs of rollers each with a larger docking roller 21, 22 and a smaller docking roller 23, 24, the axes of rotation of which $Y_1$-$Y_1$, $Y_2$-$Y_2$ are directed perpendicularly with respect to the longitudinal axes $X_1$-$X_1$, $X_2$-$X_2$ and which enclose the shafts 17, 18 between them. A second type of coupling elements comprises star-shaped positioning and coupling wheels 25, 26, the notches 27, 28 of which form the engaging components.

Returning pins 29, which protrude from the carrier rail 10, engage in the notches 27, 28 of the positioning and coupling wheels 25, 26 when there is a rearward movement of the positioning and locking shafts 19, 20 and establish a defined angular position of the positioning and coupling wheels 25, 26, which is assigned to a starting position. For this purpose, the star-shaped components of the positioning and coupling wheels 25, 26 are shaped in a suitable way.

Figure 3:
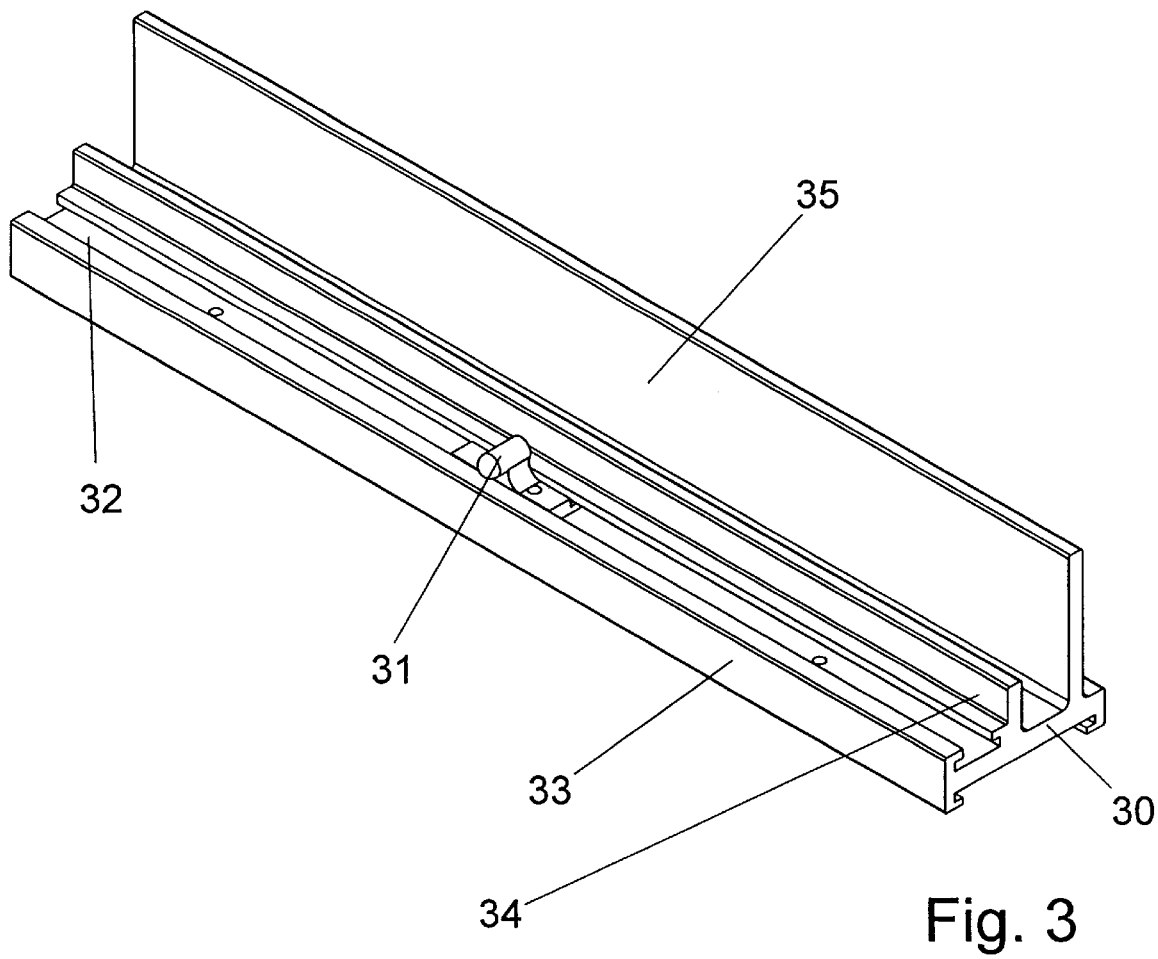
FIG. 3 shows a coupling interface for the coupling of the mobile base.
Figure 4:
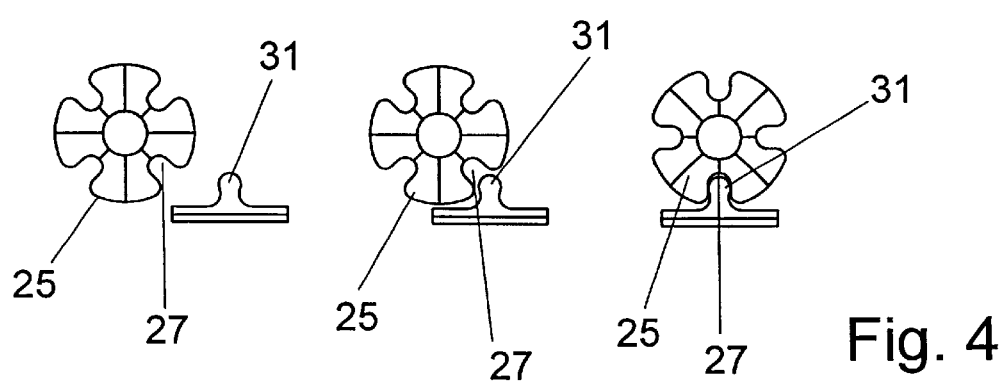
FIG. 4 shows the coupling operation for assuming an ultimate coupling position.

According to FIG. 3, the coupling interface includes a guide rail 30 and a coupling bolt 31 as fixed elements. Only the coupling bolt 31 is movable, for adjusting purposes, in a rail 32 for fixing the ultimate coupling position. Once the adjustment has been completed, this element is fixed as well. The rail 32 is directed parallel to the guide rail 30, which is made essentially as a U-profile and has a flange 33 for the guide rollers 12 to bear against.

The guide rail 30, provided in a fixed location at the destination, allows a movement in a first direction along its longitudinal extent and blocks a movement perpendicularly to this direction. As a result, the vehicle, approaching the coupling interface with its coupling mechanism, is aligned parallel to the guide rail 30 as a result of the rolling of the guide rollers 12 on the flange 33. Of the flanges of the guide rail 30, one flange 34, which is facing the vehicle during its approach, is of a smaller height than the other flange 35, although both protrude above the rail 32.

The differences in height between the flanges 34 and 35 ensure reliable docking of the appropriately designed coupling mechanism, in particular of the docking rollers 21, 22, 23, 24, the axes of rotation of which $Y_1$-$Y_1$, $Y_2$-$Y_2$ are, in the uncoupled state, directed parallel to the longitudinal extent of the guide rail 30 and parallel to the plane of movement of the vehicle. Once the guide rollers 12 are bearing against the rail 32, the shafts 17, 18 are extended until the docking rollers 21, 22, 23, 24 butt against the flanges 35.A 90° rotation of the shafts 17, 18 about their longitudinal axes $X_1$-$X_1$, $X_2$-$X_2$ causes the rollers 21 and 23 to be placed between the two flanges 34 and 35 of the guide rail 30. The vehicle can then be moved in the direction of the longitudinal extent of the guide rail 30 and is fixed in the direction perpendicular thereto. For docking, the working steps described are executed essentially in the reverse order.

The ultimate coupling position, in which one of the mechanisms 3 or 4 is aligned with respect to the destination, is assumed by one of the positioning and coupling wheels 25 or 26 being brought is into engagement with the coupling bolt 31. FIG. 4 illustrates this procedure for the positioning and coupling wheel 25, which, positioned by means of the rail 32, initially assumes the angular position of the starting position. During the movement of the vehicle along the guide rail 30, when it reaches the ultimate coupling position, the positioning and coupling wheel 25 finds the coupling bolt 31 and places itself around the latter with one of the notches 27 by a 45° rotation.

The different angular positions of the positioning and coupling wheel 25 in the uncoupled state (left-hand and central positions in FIG. 4) and in the coupled state (right-hand position in FIG. 4) are used for signal formation as changes in state of the movable elements.

Figure 5:
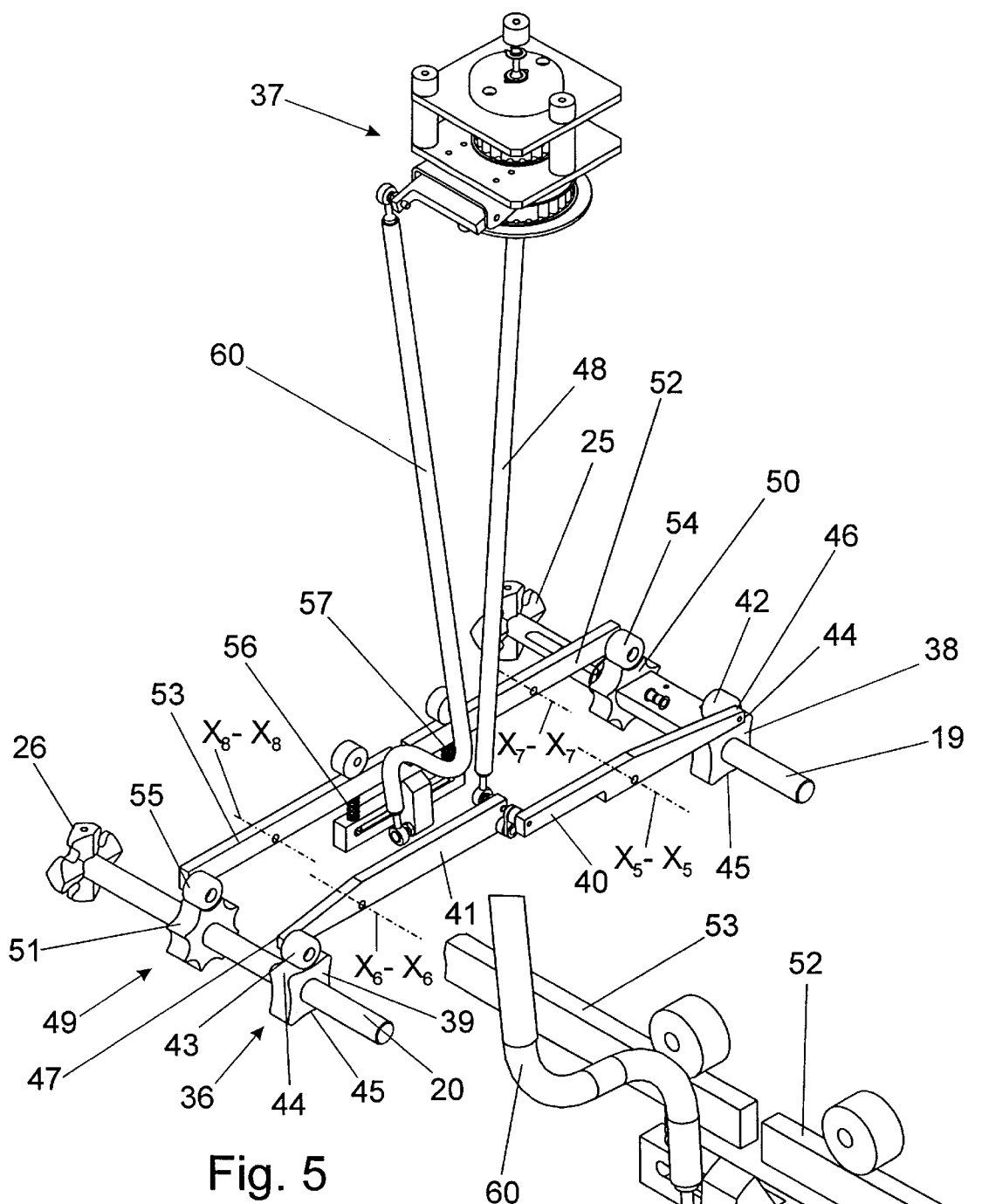
FIG. 5 shows the linking of a control device with a signal generator for generating status signals on the coupling state and an immobilizer.

The angular positions assumed by the positioning and coupling wheels 25 and 26 are recorded by a signal generator 36, included in FIG. 5, to distinguish between the uncoupled state and the coupled state, and are transformed in such a way that it is also possible to distinguish between the two positioning and coupling wheels 25 and 26. Each of these positioning and coupling wheels 25, 26 is assigned to one of the mechanisms 3, 4 via a control device 37, the signal emitted comprising complete information on the coupling state and the position of the coupling. The signal fed to the control device 37 initiates a transmission of the drive force from the drive element 5 to the coupled mechanism 3 or 4.

For this purpose, the signal generator 36 is designed in such a way that the positioning and locking shafts 19, 20 include cam elements 38, 39, on which rotatably fastened signalling rollers 42, 43 rest at the ends of signalling levers 40, 41. Of the cam elements 38, 39, alternately provided raising portions 44 and lowering portions 45 for the signalling rollers 42, 43 correlate with the angular position of the respective positioning and coupling wheel 25, 26. Axes of rotation $X_5$-$X_5$, $X_6$-$X_6$ at the signalling levers 40, 41 are situated in such a way that the ratios of the lever arms of the two signalling levers 40, 41 differ. While the lever arms on the signalling lever 40 are approximately the same in the present example, the signalling lever 41 has a much shorter lever arm on the side of its signalling roller 43 than on its other side. Changes in the vertical position of the signalling rollers 42, 43 bring about different deflections at the free lever arm ends 46, 47, which deflections are transmitted to the control device 37 through a first control rod 48.

The signal generator 36 is designed in such a way that three different signals can be fed to the control device 37. A first signal characterizes a state in which the vehicle has not accomplished a coupling with either of the mechanisms 3, 4 at the destination. In this state, the positioning and coupling wheels 25, 26 assume the angular position represented in FIG. 5, assigned to the starting position. Both signalling rollers 42, 43 are resting on the lowering portions 45 of the cam elements 38,, 39, whereby the free lever arm ends 46, 47 stay in their lower position and raise the first control rod 48 the most. If a coupling with one of the positioning and coupling wheels 25, 26 then takes place, the respective wheel is turned through 45° and one of the raising portions 45 of the cam element 38 or 39 raises the signalling roller 42 or 43. If the positioning and coupling wheel 25 comes into action for the coupling, the first control rod 48 will be lowered downward by a smaller amount than in the case of the positioning and coupling wheel 26, due to the difference which exists between the lever arm ratios of the signalling levers 40, 41. Of course, it is possible to generate electrical signals in a suitable manner instead of mechanical signals.

Figure 6:
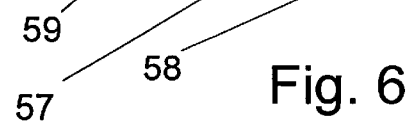
FIG. 6 shows parts of an immobilizer for preventing and enabling the moving of the object away from the destination.
Figure 7:
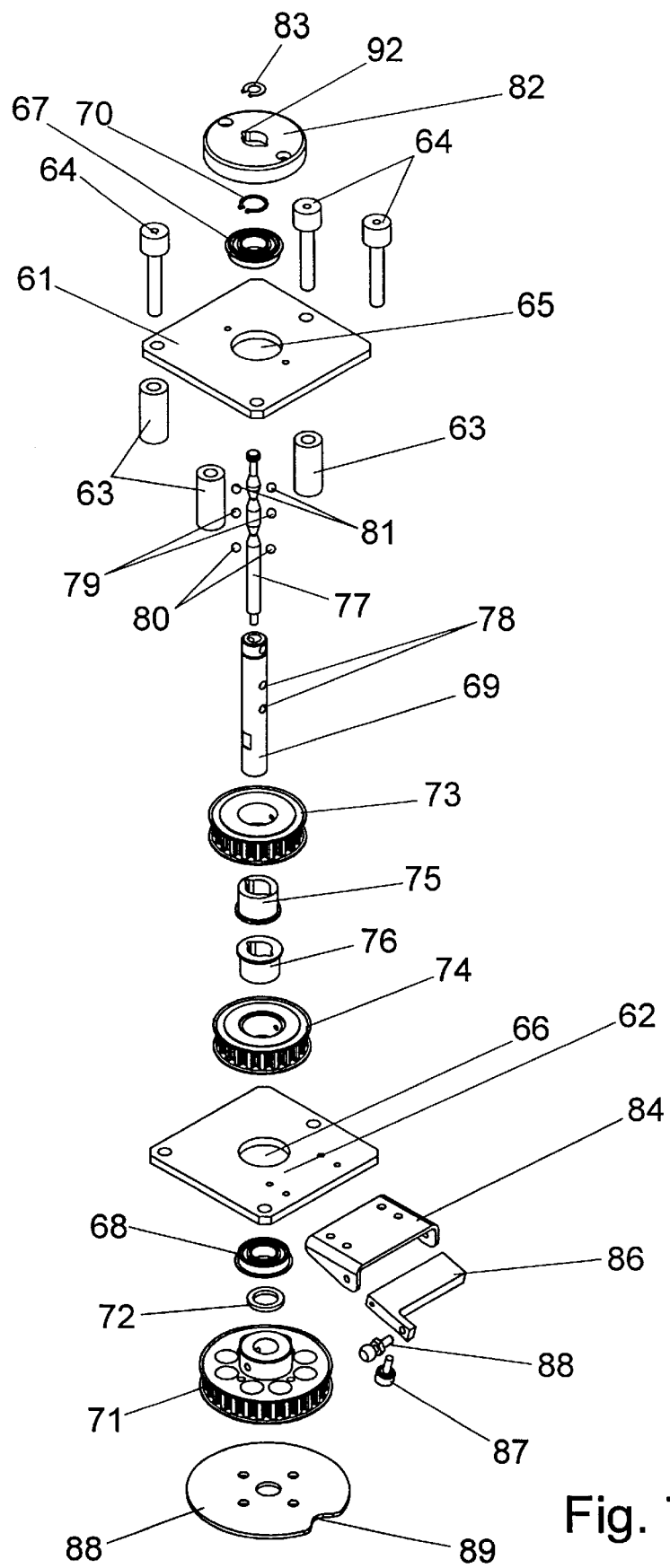
FIG. 7 shows the control device in an exploded representation.

In addition to the signal generator 36 represented in FIG. 5, the coupling mechanism also includes an immobilizer 49, according to FIG. 6, which prevents or enables a moving away of the vehicle from the destination on the basis of a signal made available on the operating state of the mechanisms 3, 4. For this purpose, the positioning and locking shafts 19, 20 include blocking wheels 50, 51, on which there rest, with the force of springs 56, 57, locking rollers 54, 55 which are rotatably fastened to locking levers 52, 53. During the rotation of one of the positioning and coupling wheels 25 or 26 about the coupling bolt 31, a detent force has to be overcome, which facilitates the locating of the coupling bolt 31 and the recognition of the ultimate coupling position. The upward and downward movement of the locking levers 52, 53, caused by the rotation of the blocking wheels 50, 51, can of course be controlled by various forms of the blocking wheels 50, 51. The locking levers 52, 53, adjustable about the axes of rotation $X_7$-$X_7$, $X_8$-$X_8$ are suitable, when in an arrested position, for preventing a rotation of the positioning and locking shafts 19, 20, due to the resting of the locking rollers 54, 55 on the blocking wheels 50, 51, and consequently for preventing a movement of the vehicle away from the ultimate coupling position. Provided for this purpose is a blocking element 59, which is rotatably mounted in a mount 58 and on which a vertically displaceable second control rod 60 acts. In its upper position, the second control rod 60 turns the blocking element 59 under the locking levers 52, 53 and prevents their movement, In the lower position, the movement is enabled. From the second control rod 60 there is, according to FIG. 5, a connection to the control device 37, from where the signal on the operating state of the mechanisms 3, 4 is sent.

The control device 37, the structural design and operating principle of which are illustrated by FIGS. 7 to 11, includes as carrying elements an upper carrier plate 61 and a lower carrier plate 62, the distance between which is determined by spacers 63 and which are held together by connecting elements 64. Centrally made bores 65, 66 in the carrier plates 61, 62 serve for receiving bearings 67, 68, which allow an internally hollow drive shaft 69 to rotate freely, a restraining ring 70 preventing the drive shaft 69 from failing out. A drive roller 71, to which a force transmission takes place from the drive element 5 through a suitable force-transmission element (not shown), is in fixed connection with the drive shaft 69 and passes on to the latter the force supplied to it. A spacer 72 prevents contact with the fixed part of the bearing 68. The free space between the carrier plates 61, 62 serves for receiving a first running roller 73 and a second running roller 74, which are displaceable on the drive shaft 69 by being fastened on bearing bushes 75, 76. For the transmission of the torque from the drive shaft 69 to the running rollers 73, 74, and consequently to the transfer mechanisms 3, 4, there is provided a control shaft 77, which is displaceable in the cavity of the drive shaft 69 and, by virtue of its shaping and two different positions, is suitable for pressing spherical driving elements 79, 80, contained in holes 78 in the wall of the drive shaft 69, into recesses of the bearing bushes 75, 76 of the running roller 73 or 74 to be driven along. A third position of the control shaft 77 is provided for the purpose of pressing further driving elements 81 partially out of the drive shaft 69 into an interlocking plate 82, rigidly connected to the carrier plate 59, so that the drive shaft 69 is blocked. The three positions of the control shaft 77 correlate with the settings of the signal generator 36, for which purpose the first control rod 48 is in connection with the control shaft 77. The control shaft 77 is also secured by a restraining ring 83, here against failing out from the drive shaft 69.

In addition to the controlling of the force transmission from a drive to two mechanisms, to be selected separately from each other, on the basis of an external signal, the control device 37 also has the task of itself providing a signal, which characterizes the operating state of the two mechanisms. There is also an alternative possibility to generate electronical signals. The signal is intended for the actuation of the immobilizer 49. If one of the two mechanisms 3, 4 is in operation, the vehicle must not be moved away from the destination. Only when both mechanisms 3, 4 are not in operation, i.e. when no container transport is taking place, may the vehicle be moved to another destination.

Figure 8:
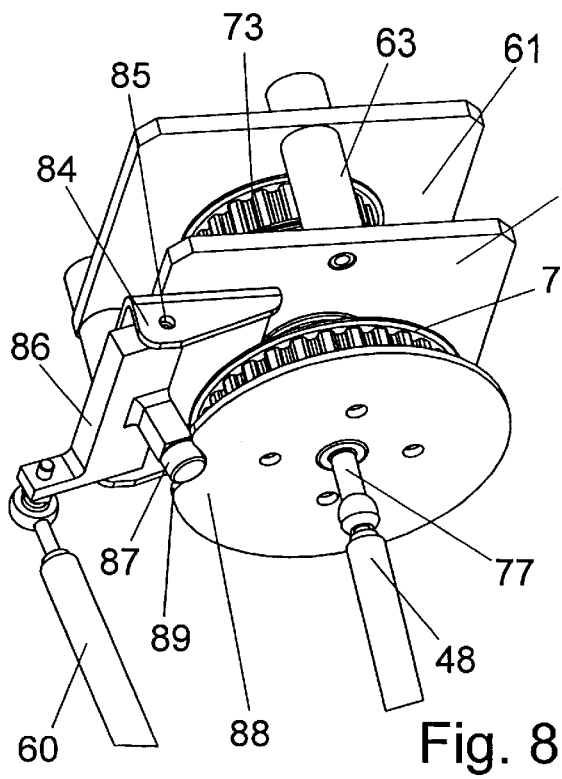
FIG. 8 shows the control device in a perspective representation from below.

For this purpose, according to FIG. 8 there is fastened on the lower carrier plate 62 a mount 84, which carries an interlocking lever 86 in a joint 85. While an interlocking roller 87 is rotatably secured to one end of the lever, the other end of the lever has a pin, on which the second control rod 60 acts. Furthermore, the drive roller 71 is fixedly connected to an interlocking flange 88, which includes a locking notch 89 in the region of its edge. When neither of the mechanisms 3, 4 are being operated, the interlocking roller 87 lies in the locking notch 89. The second control rod 60 is located in its lower position, in which the movement of the immobilizer 49 is out of operation. If the drive roller 71 is set in motion, to actuate one of the mechanisms 3, 4, the interlocking roller 87 is lifted out of the locking notch 89, whereby the other end of the interlocking lever 86 is raised, with the second control rod 60 fastened thereto. As a consequence, the immobilizer 49 blocks the movement of the positioning and locking wheels 19, 20, as already described.

Figure 9:
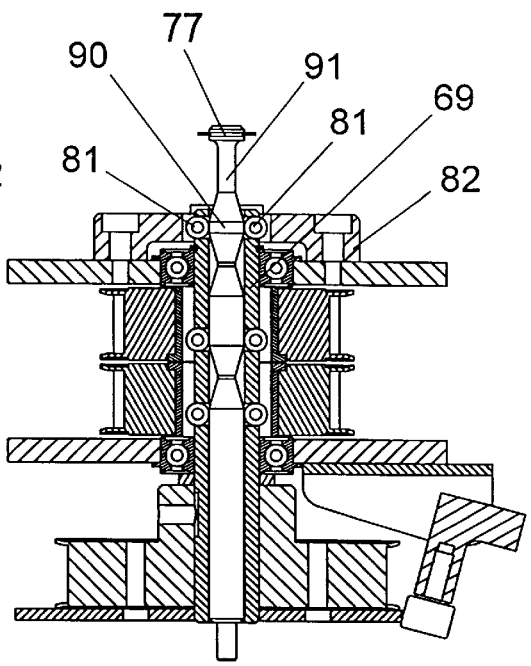
FIG. 9 shows a section through the control device in a state in which there is no force transmission to one of the rollers.
Figure 10:
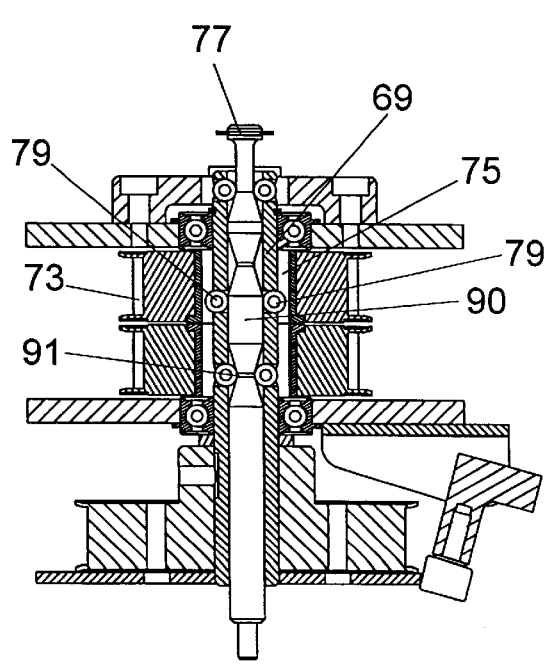
FIG. 10 shows a section through the control device in a state in which there is force transmission to the upper roller.
Figure 11:
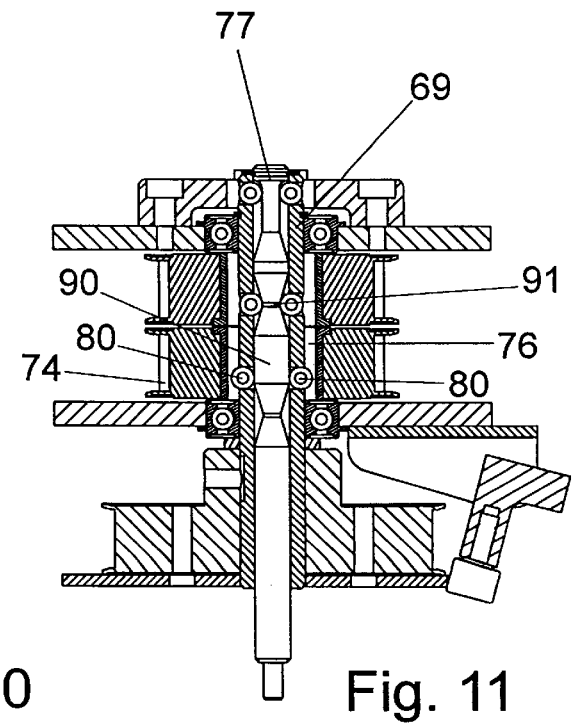
FIG. 11 shows a section through the control device in a state in which there is force transmission to the lower roller.

The torque transmission in the control device 37 is explained by FIGS. 9 to 11. If the vehicle is not connected to the coupling interface present at the destination, operation of the mechanisms 3, 4 is to be prevented. The control rod 48 and the control shaft 77, connected to the latter, assume their uppermost positions, which corresponds to the representations in FIGS. 5 and 9. The profile made in the control shaft 77 includes alternately regions of larger shaft diameter 90 and regions of smaller shaft diameter 91, of which one of the regions 90 presses the driving elements 81 into recesses 92 provided in the interlocking plate 82 and blocks the drive shaft 69.

In FIG. 10, the control shaft 77 is in a central position, which is brought about by the positioning and coupling wheel 25 being active for the coupling and by the control rod 60 being adjusted vertically by the signalling lever 40. The driving elements 79 are pressed out of the drive shaft 69 into recesses in the bearing bush 75, whereby a transmission of the torques to the running roller 73 is ensured.

In FIG. 11, the driving elements 80 are in connection with the bearing bush 76, so that a transmission of the torques to the running roller 74 can take place. The present, lower position of the control shaft 77 is a consequence of the coupling of the positioning and coupling wheel 26 to the coupling interface and is produced by the adjustment of the control rod 60 via the control lever 41.

While the foregoing description and drawings represent the present invention, it will be obvious to those skilled in the art that various changes may be made therein without departing from the true spirit and scope of the present invention.

What is claimed is:

1. A control device for controlling a drive of a substrate container transfer device including at least two substrate container transfer mechanisms operating separately from one another, the control device being adapted to respond to at least one state of the mechanisms, the mechanisms being adapted to he positioned in different states, comprising:

means for receiving a drive force, said means for receiving a drive force being fixedly connected to a hollow drive shaft, wherein a force exerted on said means for receiving a drive force is passed onto said drive shaft;

first and second means for power delivery displaceable an said drive shaft, which operate separately from one another and each of which being assigned to one of the mechanisms, said first and second means for power delivery being adapted to selectively receive said force passed onto said drive shaft;

means for power transmission, which operate in settings different from one another, a first setting preventing power transmission from said means for receiving the drive force to said means for power delivery, a second setting transmitting the drive force to said first means for power delivery and a third setting transmitting the drive force to said second means for power delivery, said drive shaft being in selective communication with said means for power transmission in each of said first, second and third settings; and signal-receiving means at said means for power transmission for receiving a control signal dependent on the state of the mechanisms for producing the various settings of said means for power transmission, the signal receiving means being connected to a signal generator to generate control signals for the power transmission, a device for signal transmission, of which a first signal represents a power transmission from said means for receiving the drive force to said means for power delivery and a second signal represents an interruption in the power transmission, said first signal preventing a change in a state of a mechanism which has been put into operation, operation, and said second signal allowing a change in the the device for signal transmission being coupled to a blocking device to prevent or allow a change in state of the mechanism, wherein at least one mechanism state comprises an aligned and coupled state with respect to a reference location, the aligned and coupled state being determined for an aligned mechanism for the transfer of items by the aligned mechanism wherein at least one alignment and coupling means for assuming the aligned and coupled states is fastened on a mobile base, on which said blocking device prevents or allows a movement away from said reference location on the basis of said first and second signals, and wherein the means for power transmission comprises a control shaft which is mounted axially displaceably in the interior of a hollow shaft and, depending on the displacement of the control shaft, engages drivers into said first and second means for power delivery for the purposes of power transmission, and drivers which are locked by a fixed part of the control device for the purpose of preventing power transmission.

2. The device according to claim 1, wherein said control shaft for the axial displacement is connected to said signal generator via a control rod.

3. The device according to claim 2, wherein said means for receiving a drive force are designed as a drive roller connected to the hollow shaft and in which said first and second means for power delivery are idling rollers which are mounted rotatably on the hollow shaft and on which the drivers act through openings in the hollow shaft.

4. The device according to claim 3, wherein said signal generator is in connection with movable coupling elements on said mobile base, which engage in fixed coupling elements at said reference location for the purpose of alignment and coupling.

5. A control device for controlling a drive of a substrate container transfer device including at least two substrate container transfer mechanisms comprising:

a means for receiving a drive force;

a first and second means for power delivery, said first and second means for power delivery operating separately from one another and in selective communication with the drive force, the first and second means for power delivery each assigned to a first and a second mechanism, respectively;

a control shaft adapted for power transmission to the first and second means for power delivery, the control shaft being mounted axially displaced in an interior of a hollow shaft connected to the means for receiving a drive force, the control shaft adapted to selectively engage a first setting preventing power transmission from the means for receiving the drive force to the first and second means for power delivery, a second setting transmitting the drive force to the first means for power delivery and a third setting transmitting the drive force to the second means for power delivery; and a signal-receiving means at the control shaft for receiving a control signal from a signal generator means corresponding to a state of the substrate container transfer mechanisms, the signal-receivinig means adapted to provide a power transmission control signal to cause the control shaft to selectively engage the first, second and third settings; wherein said signal generator means is in connection with movable coupling elements on a mobile base, which engage in fixed coupling elements at a reference location for the purpose of alignment and coupling.

6. The device according to claim 5, wherein the control shaft is connected to the signal generator means via a control rod.

7. The device according to claim 5, where said means for receiving a drive force is a drive roller connected to the hollow shaft and in which the first and second means for power delivery are idling rollers which are mounted rotatably on the hollow shaft and on which drivers act through openings in the hollow shaft.

* * * * *